(12) United States Patent
Kashima

(10) Patent No.: US 8,580,334 B2
(45) Date of Patent: Nov. 12, 2013

(54) METHOD OF FORMING ELECTRODE OF PIEZOELECTRIC ELEMENT

(71) Applicant: NHK Spring Co., Ltd., Kanagawa (JP)

(72) Inventor: Hideki Kashima, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 13/654,731

(22) Filed: Oct. 18, 2012

(65) Prior Publication Data

US 2013/0040048 A1 Feb. 14, 2013

Related U.S. Application Data

(62) Division of application No. 12/697,638, filed on Feb. 1, 2010, now Pat. No. 8,331,060.

(30) Foreign Application Priority Data

Feb. 4, 2009 (JP) .................................. 2009-023510

(51) Int. Cl.
*B05D 5/12* (2006.01)
*H01L 41/22* (2013.01)

(52) U.S. Cl.
USPC .......................................... 427/100; 29/25.35

(58) Field of Classification Search
USPC ................... 427/100; 29/25.35; 360/294.4
See application file for complete search history.

(56) References Cited

U.S. PATENT DOCUMENTS

| | | | |
|---|---|---|---|
| 6,661,618 B2 * | 12/2003 | Fujiwara et al. | 360/294.4 |
| 6,912,288 B2 * | 6/2005 | Nakashima et al. | 381/190 |
| 7,130,159 B2 | 10/2006 | Shimizu et al. | |
| 7,167,344 B2 | 1/2007 | Nakagawa et al. | |
| 7,280,319 B1 * | 10/2007 | McNab | 360/294.4 |
| 7,459,835 B1 | 12/2008 | Mei et al. | |
| 7,746,600 B2 | 6/2010 | Hancer et al. | |
| 8,022,598 B2 | 9/2011 | Kuegerl et al. | |
| 8,094,416 B2 * | 1/2012 | Hanya et al. | 360/294.4 |
| 8,125,124 B2 | 2/2012 | Kondo et al. | |
| 2002/0039261 A1 | 4/2002 | Sividasan et al. | |
| 2006/0207078 A1 | 9/2006 | Namerikawa et al. | |
| 2008/0290439 A1 * | 11/2008 | Shoji | 257/434 |
| 2009/0080117 A1 | 3/2009 | Shimizu et al. | |

FOREIGN PATENT DOCUMENTS

| | | |
|---|---|---|
| JP | 8-330642 | 12/1996 |
| JP | 2000-357377 | 12/2000 |
| JP | 2002-050140 | 2/2002 |
| JP | 2002-117638 | 4/2002 |
| JP | 2002-373475 | 12/2002 |
| JP | 2003-061371 | 2/2003 |

* cited by examiner

*Primary Examiner* — Brian K Talbot
(74) *Attorney, Agent, or Firm* — Jordan and Hamburg LLP

(57) ABSTRACT

An electrode structure of a piezoelectric element is provided. The piezoelectric element 23a (23b) constitutes a piezoelectric actuator 19 attached to an attaching part 30 of an object, to minutely move a movable part 15 of the object relative to a base part 13 of the object according to deformation occurring on the piezoelectric element in response to a power applied state of the piezoelectric element. The electrode structure in response an electrode 41a formed on one of a pair of electrode forming faces 31a and 31b of the piezoelectric element on an inner side of a peripheral zone 31a1, the peripheral zone being defined along the periphery of the electrode forming face 31a on which the electrode is formed. The electrode structure also includes a non-electrode part 51 formed in the peripheral zone. Even if the peripheral zone 31a1 of the electrode forming face 31a having a short-circuit causing possibility touches the attaching part 30, no short circuit occurs.

7 Claims, 10 Drawing Sheets

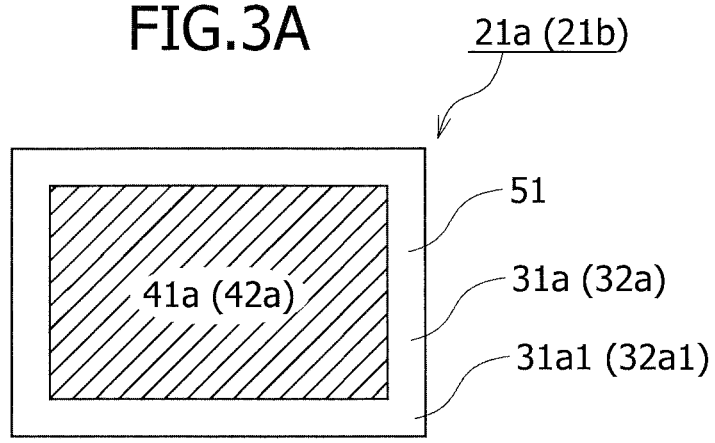
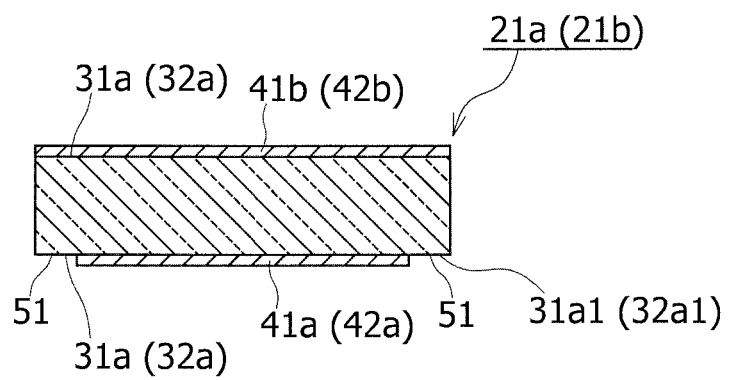
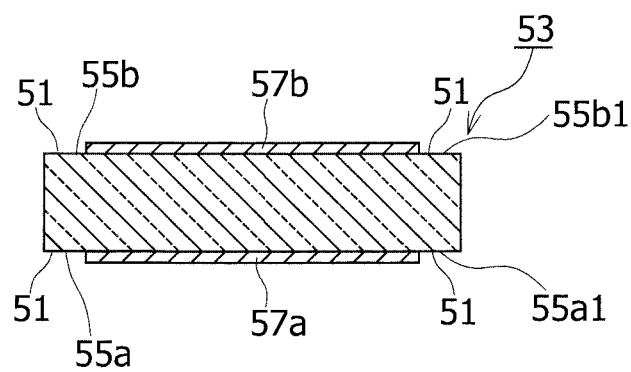

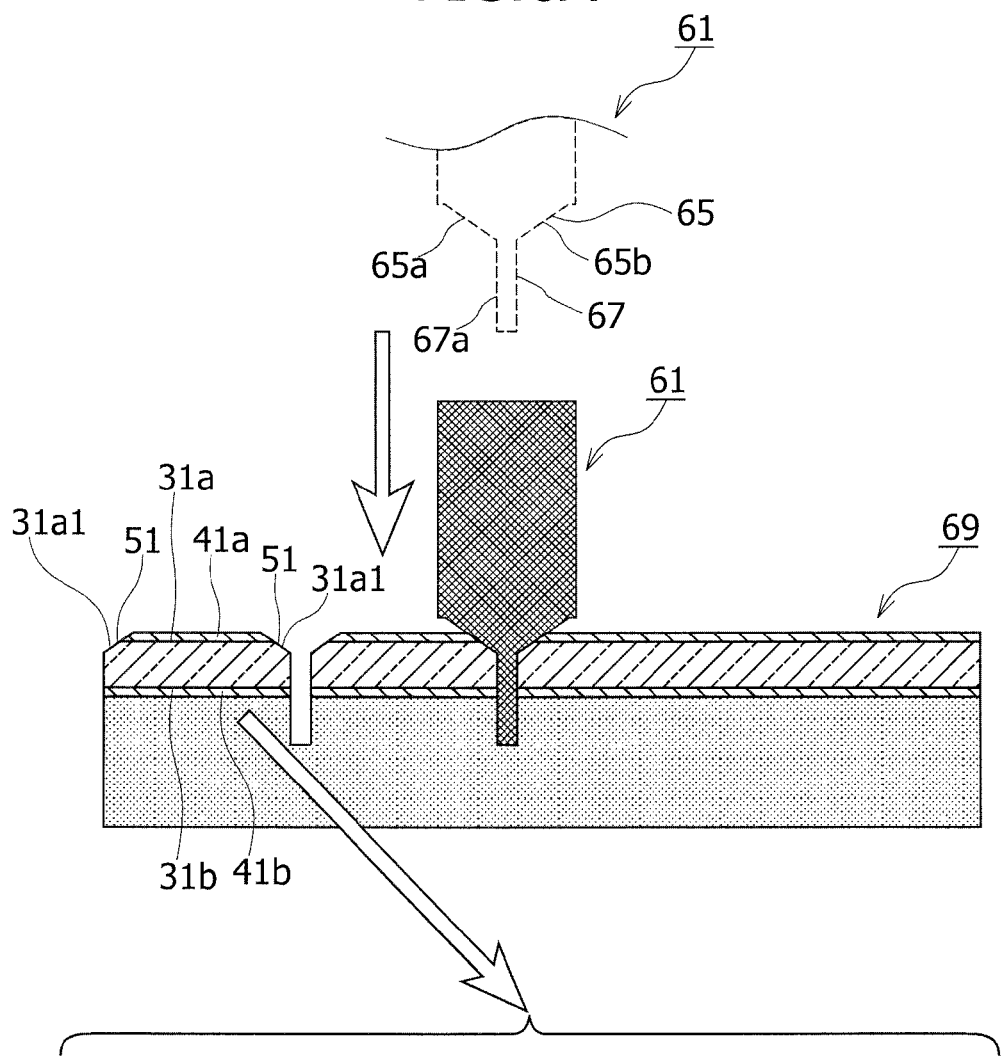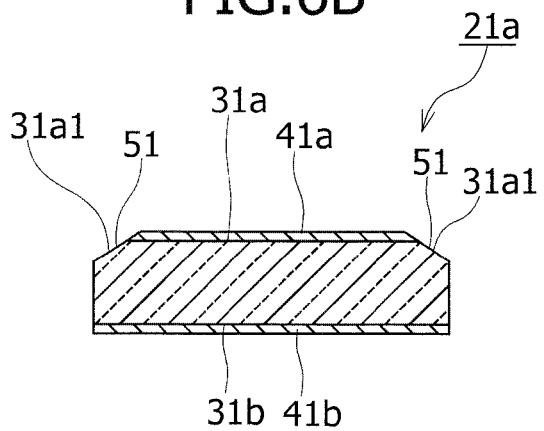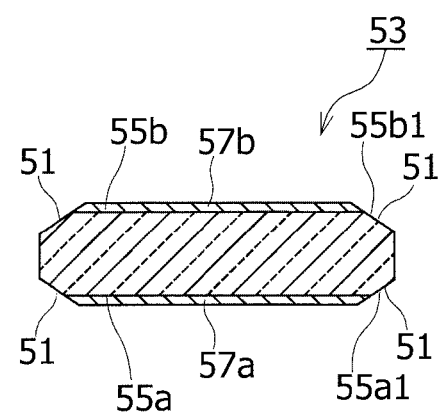

METHOD OF FORMING ELECTRODE OF PIEZOELECTRIC ELEMENT

BACKGROUND OF THE INVENTION

1. Field of the Invention

The present invention relates generally to a head suspension of a disk drive incorporated in an information processing apparatus such as a personal computer, and particularly, to an electrode structure of a piezoelectric element used for the head suspension and a method of forming an electrode of the piezoelectric element.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

To meet the needs, the applicant of the present invention has proposed in Japanese Unexamined Patent Application Publication No. 2002-50140 a head suspension for a disk drive, including a base plate, a connection plate having a hinge thinner than the base plate, a load beam provided with a flexure, and a piezoelectric actuator composed of a pair of piezoelectric elements.

This related art employs a dual actuator system that involves, for a precise positioning purpose, a voice coil motor and the piezoelectric actuator having two piezoelectric elements made of, for example, PZT (lead zirconate titanate). The piezoelectric actuator in the dual actuator system minutely moves a front end of the load beam in a widthwise direction (sway direction) of the head suspension.

Compared with a single actuator system employing only the voice coil motor, the dual actuator system employing the voice coil motor and piezoelectric actuator is capable of more precisely positioning a magnetic head attached to a front end of the head suspension.

In the head suspension employing the dual actuator system, the piezoelectric actuator is arranged in an opening formed in a piezoelectric element attaching part prepared on, for example, the base plate.

Each piezoelectric element in the piezoelectric actuator has upper and lower faces that are covered with electrodes. The electrodes of each piezoelectric element are connected to wiring through which power is supplied to the electrodes. The opening in the piezoelectric element attaching part of the head suspension has a support to support the bottom faces of the piezoelectric elements.

To effectively use a space, the piezoelectric elements are arranged in the opening close to the periphery of the opening, and therefore, the electrodes of the piezoelectric elements have a risk of contacting the attaching part. If the electrodes of the piezoelectric elements touch the attaching part, power supply to the piezoelectric elements will be hindered. To avoid this, the electrodes of the piezoelectric elements must electrically be insulated from the attaching part.

For the electric insulation, a related art employs an adhesive containing a filler made of insulative particles. The adhesive is applied so that the filler may interpose between the electrodes of the piezoelectric elements and the piezoelectric element attaching part of the head suspension.

The filler tends to unevenly disperse in the adhesive, to cause a short circuit between the electrodes of the piezoelectric elements and the attaching part at a location where the filler in the adhesive is sparse.

Such a risk of causing a short circuit between the electrodes of the piezoelectric elements and the attaching part increases when the piezoelectric elements are placed obliquely in the opening of the attaching part, or close to the edge of the opening.

SUMMARY OF THE INVENTION

An object of the present invention is to provide an electrode structure of a piezoelectric element, capable of preventing a short circuit between an electrode of the piezoelectric element and an attaching part to which the piezoelectric element is attached.

In order to accomplish the object, an aspect of the present invention provides an electrode structure of a piezoelectric element, the piezoelectric element constituting a piezoelectric actuator arranged on an object to minutely move a movable part of the object relative to a base part of the object according to deformation occurring on the piezoelectric element in response to a power applied state of the piezoelectric element. The electrode structure includes an electrode formed on one of a pair of electrode forming faces of the piezoelectric element on an inner side of a peripheral zone, the peripheral zone being defined along the periphery of the electrode forming face on which the electrode is formed. The electrode structure also includes a non-electrode part formed in the peripheral zone.

This aspect of the present invention causes no short circuit between the electrode of the piezoelectric element and the object even if the peripheral zone of the piezoelectric element touches the object.

BRIEF DESCRIPTION OF THE DRAWINGS

FIGS. 3A to 3C are views illustrating the piezoelectric element, in which FIG. 3A is a bottom view of an electrode forming face of the piezoelectric element, FIG. 3B is a front view of the piezoelectric element, and FIG. 3C is a front view of a modification of the piezoelectric element;

FIGS. 6A to 6C are views illustrating the details of the wafer cutting of FIG. 5, in which FIG. 6A is an enlarged view of the dicing blade, FIG. 6B is a sectional view of a piezoelectric element with a tapered electrode on one electrode forming face, and FIG. 6C is a sectional view of a piezoelectric element with a tapered electrode on each electrode forming face;

FIGS. 7A and 7B are views illustrating operations of head suspensions, in which FIG. 7A is a head suspension with the piezoelectric element of FIG. 3B and FIG. 7B is a head suspension with the piezoelectric element of FIG. 3C;

FIGS. 10A and 10B are views illustrating the piezoelectric element of FIG. 8, in which FIG. 10A is a top view of the piezoelectric element and FIG. 10B is a front view of the piezoelectric element.

DETAILED DESCRIPTION OF EMBODIMENTS

An electrode structure of a piezoelectric element, a method of forming an electrode of a piezoelectric element, a piezoelectric actuator, and a head suspension according to embodiments of the present invention will be explained.

First, a head suspension employing piezoelectric elements each with an electrode structure according to an embodiment of the present invention will be explained.

Figure 1:
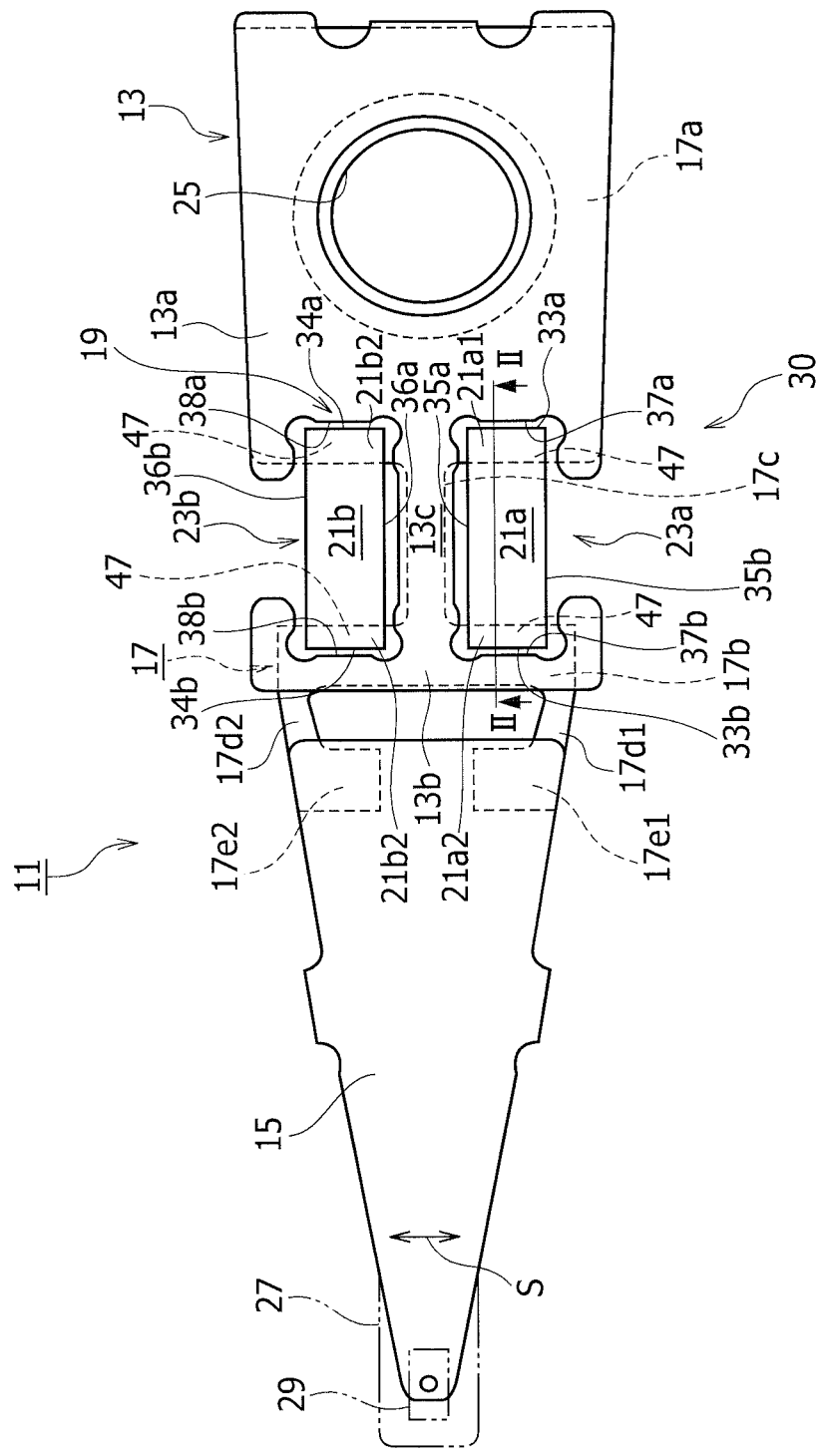
FIG. 1 is a plan view illustrating a head suspension employing piezoelectric elements each with an electrode structure according to an embodiment of the present invention.
Figure 2:
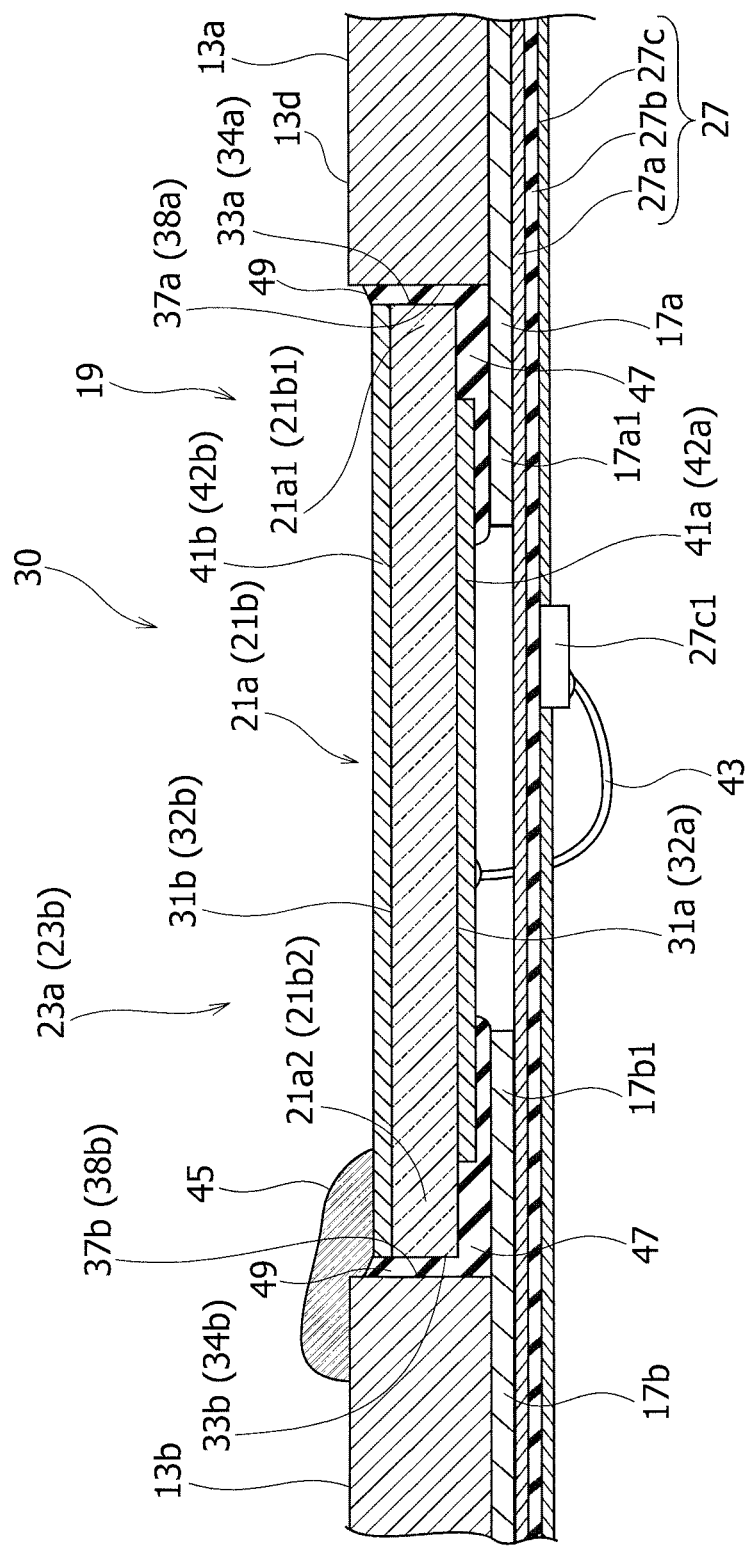
FIG. 2 is a sectional view taken along a line II-II of FIG. 1.

FIG. 1 is a plan view illustrating the head suspension 11 and FIG. 2 is a sectional view taken along a line II-II of FIG. 1.

The head suspension 11 of FIG. 1 employs the dual actuator system using a voice coil motor (not illustrated) and a piezoelectric actuator. The head suspension 11 has a base plate 13, a load beam 15, a hinge member 17, and the piezoelectric actuator 19.

The piezoelectric actuator 19 consists of a piezoelectric element 21 (first piezoelectric element 21a and second piezoelectric element 21b) that deforms in response to electricity applied thereto, to slightly move a front end of the load beam 15 in a sway direction, i.e., a widthwise direction of the head suspension 11.

The base plate 13 resiliency supports the load beam 15 and is made of, for example, a resilient stainless steel thin plate having a thickness of about 150 to 200 μm.

The base plate 13 has a base part 13a, a front part 13b, a connection part 13c to connect the base part 13a and front part 13b to each other, a pair of openings 23a and 23b, and a circular boss 25.

The openings 23a and 23b are parallel to each other and are defined by the base part 13a, front part 13b, and connection part 13c of the base plate 13 and function to receive the rectangular piezoelectric elements 21a and 21b, respectively. The piezoelectric elements 21a and 21b are made of, for example, PZT (lead zirconate titanate) and deform according to a power supplied state.

The base part 13a of the base plate 13 is fixed to a front end of an actuator arm (not illustrated) that is driven by the voice coil motor (not illustrated). The connection part 13c is formed to minutely bend in widthwise directions of the load beam 15 (sway directions indicated with arrows S in FIG. 1).

The load beam 15 is provided with a flexure 27. At a front end of the flexure 27, a magnetic head slider 29 is arranged. The load beam 15 is made of a resilient stainless steel thin plate having a thickness of about 30 to 150 μm to apply load onto the slider 29.

The flexure 27 is made of a resilient stainless thin plate that is thinner and more precise than the load beam 15. As illustrated in FIG. 2, the flexure 27 is composed of a conductive base layer 27a, an electric insulating layer 27b, and a conductor layer 27c that are laid one on another from the hinge member 17. The flexure 27 is fixed to the hinge member 17 by laser spot welding.

The conductive base layer 27a is made of a metal thin plate such as a stainless steel thin plate. The insulating layer 27b is made of an electric insulating material such as polyimide resin. The conductor layer 27c is made of an electric conductive material such as copper and nickel. The conductor layer 27c is used to supply power to electrodes of the piezoelectric element 21 and transmit write and read signals to and from the magnetic head slider 29.

A rear end of the load beam 15 is fixed to the hinge member 17 by, for example, laser spot welding.

The hinge member 17 is made of a resilient stainless steel thin plate having a thickness of about 30 to 50 μm.

The hinge member 17 has a base part 17a, a bridge 17c, an intermediate part 17b, a pair of left and right hinges 17d1 and 17d2, and a pair of left and right front end parts 17e1 and 17e2.

The base part 17a of the hinge member 17 corresponds to the base part 13a of the base plate 13, The base part 17a is laid on and fixed to the base part 13a. The intermediate part 17b of the hinge member 17 corresponds to the front part 13b of the base plate 13. The intermediate part 17b is laid on and fixed to the front part 13b. The bridge 17c of the hinge member 17 corresponds to the connection part 13c of the base plate 13. The bridge 17c is laid on and fixed to the connection part 13c, The hinges 17d1 and 17d2 bend in thickness directions, to reduce the bending rigidity of the load beam 15. The front end parts 17e1 and 17e2 of the hinge member 17 are fixed to the rear end of the load beam 15.

In FIG. 1, the base plate 13 and hinge member 17 are separate parts and are assembled together, to form an actuator base 30 serving as an attaching part to attach the piezoelectric element 21.

The piezoelectric actuator 19 consists of the pair of first and second piezoelectric elements 21a and 21b provided with electrodes to be explained later. The piezoelectric actuator 19 has a thickness of about 0.07 to 0.20 mm.

As illustrated in FIGS. 1 and 2, the first piezoelectric element 21a has a lower electrode forming face 31a, an upper electrode forming face 31b, end faces 33a and 33b, and side faces 35a and 35b.

Similarly, the second piezoelectric element 21b has a lower electrode forming face 32a, an upper electrode forming face 32b, end faces 34a and 34b, and side faces 36a and 36b.

Among reference marks in FIG. 2, those with parentheses represent elements of the second piezoelectric element 21b corresponding to elements of the first piezoelectric element 21a that are represented with reference marks without parentheses. For example, "31a (32a)" in FIG. 2 indicates the lower electrode forming face 31a of the first piezoelectric element 21a and the corresponding lower electrode forming face 32a of the second piezoelectric element 21b.

The piezoelectric elements 21a and 21b are parallel to each other and are embedded in the openings 23a and 23b, respectively. Namely, the piezoelectric elements 21a and 21b are accommodated in the openings 23a and 23b so that upper electrodes 41b and 42b of the piezoelectric elements 21a and 21b are flush with or lower than an upper face 13d of the base plate 13.

As illustrated in FIGS. 1 and 2, the first piezoelectric element 21a is received in the opening 23a at a predetermined position. In this state, the end faces 33a and 33b of the piezoelectric element 21a face inner side faces 37a and 37b of the opening 23a with predetermined clearances 49 between them. The side face 35a of the piezoelectric element 21a faces a side face of the connection part 13c with a predetermined clearance between them.

Similarly, the second piezoelectric element 21b is received in the opening 23b at a predetermined position. In this state, the end faces 34a and 34b of the piezoelectric element 21b face inner side faces 38a and 38b of the opening 23b with predetermined clearances 49 between them. The side face 36a of the piezoelectric element 21b faces a side face of the connection part 13c with a predetermined clearance between them.

The lower and upper electrode forming faces 31a and 31b of the first piezoelectric element 21a are provided with lower and upper electrodes 41a and 41b, respectively, made of a material having a good electrical conductivity, such as gold (Au).

Similarly, the lower and upper electrode forming faces 32a and 32b of the second piezoelectric element 21b are provided with lower and upper electrodes 42a and 42b, respectively, made of a material having a good electrical conductivity, such as gold (Au).

The electrodes 41a, 41b, 42a, and 42b are formed by vapor deposition, spattering, plating, and the like, as will be explained later.

The lower electrode 41a (42a) is bonded through a wire 43 to a terminal 27c1 formed on the conductive layer 27e of the flexure 15. The upper electrode 41b (42b) is grounded through a conductive adhesive such as a silver paste 45 to the base plate 13.

A rear end 21a1 of the first piezoelectric element 21a is positioned to face the base part 17a of the hinge member 17 and a front end 21a2 thereof is positioned to face the intermediate part 17b of the hinge member 17.

Similarly, a rear end 21b1 of the second piezoelectric element 21b is positioned to face the base part 17a of the hinge member 17 and a front end 21b2 thereof is positioned to face the intermediate part 17b of the hinge member 17.

At front and rear ends of the openings 23a and 23b, there are widthwise supports 17a1 and 17b1 to support the lower electrode forming faces 31a and 32a of the piezoelectric elements 21a and 21b.

The rear end 21a1 of the first piezoelectric element 21a is fixed with a nonconductive adhesive 47 to the support 17a1 formed at the base part 17a of the hinge member 17. The front end 21a2 of the piezoelectric element 21a is fixed with the nonconductive adhesive 47 to the support 17b1 formed at the intermediate part 17b of the hinge member 17.

Similarly, the rear end 21b1 of the second piezoelectric element 21b is fixed with the nonconductive adhesive 47 to the support 17a1 formed at the base part 17a of the hinge member 17. The front end 21b2 of the piezoelectric element 21b is fixed with the nonconductive adhesive 47 to the support 17b1 formed at the intermediate part 17b of the hinge member 17.

The nonconductive adhesive 47 may be a known nonconductive adhesive (including a conductive adhesive containing insulating silica or glass filler particles).

The nonconductive adhesive 47 forms a layer of proper thickness between the lower electrode forming faces 31a and 32a of the piezoelectric elements 21a and 21b and the supports 17a1 and 17b1.

The thickness of the nonconductive adhesive layer 47 is preferably 10 μm or thicker. The insulating layer of such a thickness secures electric insulation between the lower electrodes 41a and 42a on the lower electrode forming faces 31a and 32a and the supports 17a1 and 17b1.

Each of the clearances 49 between the piezoelectric elements 21a and 21b and the end faces 37a, 37b, 38a, and 38b of the openings 23a and 23b contains a layer of the nonconductive adhesive 47 having a proper thickness.

The nonconductive adhesive layer 47 between the piezoelectric elements 21a and 21b and the end faces 37a, 37b, 38a, and 38b of the openings 23a and 23b surely transmits displacements of the piezoelectric elements 21a and 21b to the load beam 15 and secures electric insulation between the upper and lower electrodes 41a, 41b, 42a, and 42b of the piezoelectric elements 21a and 21b and the end faces 37a, 37b, 38a, and 38b of the openings 23a and 23b.

When a predetermined voltage is applied, one of the piezoelectric elements 21a and 21b contracts in a longitudinal direction and the other extends in a longitudinal direction, and therefore, the piezoelectric elements 21a and 21b deform into a trapezoidal shape as a whole.

According to the deformation and displacement of the piezoelectric elements 21a and 21b, the front end of the load beam 15 moves relative to the base plate 13 in a widthwise direction (sway direction).

An electrode structure of the piezoelectric element according to an embodiment of the present invention will be explained.

FIGS. 3A to 3C are views illustrating the piezoelectric element 21a (21b) illustrated in FIG. 1, in which FIG. 3A is a bottom view of the electrode forming face 31a (32a) of the piezoelectric element, FIG. 3B is a front view of the piezoelectric element, and FIG. 3C is a front view of a modification of the piezoelectric element.

According to the embodiment illustrated in FIGS. 2, 3A, and 3B, the lower electrode forming face 31a (32a) of the piezoelectric element 21a (21b) includes a peripheral zone 31a1 (32a1), the lower electrode 41a (42a) formed on an inner side of the peripheral zone 31a1 (32a1), and a non-electrode part 51 formed in the peripheral zone 31a1 (32a1).

The upper electrode forming face 31b (32b) of the piezoelectric element 21a (21b) is entirely covered with the upper electrode 41b (42b).

Namely, according to the embodiment, the lower electrode forming face 31a (32a) has the non-electrode part 51 in the peripheral zone 31a1 (32a1) and the upper electrode forming face 31b (32b) has only the upper electrode 41b (42b) and no non-electrode part 51.

According to the embodiment, the upper electrodes 41b and 42b have the same potential as the actuator base (attaching part) 30 of the head suspension 11, and therefore, the upper electrode forming faces 31b and 32b need no measure for preventing a short circuit.

On the other hand, the lower electrode forming faces 31a and 32a must be protected against a short circuit. For this, the non-electrode part 51 is formed in each of the peripheral zones 31a1 and 32a1, so that no short circuit occurs even if the peripheral zones 31a1 and 32a1 of the lower electrode forming faces 31a and 32a having a short-circuit causing possibility touch the actuator base (attaching part) 30.

Depending on the structure of a head suspension to which the present invention is applied, the lower electrode forming face of a piezoelectric element may need no short-circuit preventive measure and the upper electrode forming face thereof needs the short-circuit preventive measure. In this case, the upper electrode forming face is provided with the non-electrode part in the peripheral zone and the lower electrode forming face is provided with no non-electrode part.

In this way, the electrode structure for a piezoelectric element according to the embodiment is applicable to the head suspension 11 of FIG. 1 that needs a short-circuit preventive measure for one of the upper and lower electrode forming faces of the piezoelectric element. This electrode structure is capable of preventing a short circuit between the electrode 41a (42a) of the piezoelectric element 21a (21b) and the actuator base (attaching part) 30.

Depending on the structure of a head suspension, the lower and upper electrode forming faces of each piezoelectric element must be provided with the short-circuit preventive measure.

This is achieved by an electrode structure according to a modification of the present invention illustrated in FIG. 3C. In FIG. 3C, a piezoelectric element 53 has a lower electrode forming face 55a and an upper electrode forming face 55b. The lower electrode forming face 55a has a lower electrode 57a and a peripheral zone 55a1. The lower electrode 57a is surrounded by the peripheral zone 55a1 and a non-electrode part 51 is formed in the peripheral zone 55a1. The upper electrode forming face 55b has an upper electrode 57b and a peripheral zone 55b1. The upper electrode 57b is surrounded by the peripheral zone 55b1 and a non-electrode part 51 is formed in the peripheral zone 55b1.

In FIG. 3C, each of the lower and upper electrodes 57a and 57b on the lower and upper electrode forming faces 55a and 55b is surrounded by the non-electrode part 51, so that no short circuit occurs even if the peripheral zones 55a1 and 55b1 of the lower and upper electrode forming faces 55a and 55b having a short-circuit causing possibility touch the actuator base (attaching part) 30 of the head suspension 11.

In this way, the piezoelectric element electrode structure according to the modification is applicable to the head suspension that needs a short-circuit preventive measure for each of the upper and lower electrode forming faces of the piezoelectric element. This electrode structure is capable of preventing a short circuit between the electrodes 57a and 57b of the piezoelectric element 53 and the actuator base (attaching part) 30 of the head suspension 11.

A method of forming an electrode structure of a piezoelectric element according to an embodiment of the present invention will be explained with reference to FIG. 4.

The method will be explained in detail in connection with forming the electrode structure of the first piezoelectric element 21a illustrated in FIGS. 3A and 3B.

Figure 4:
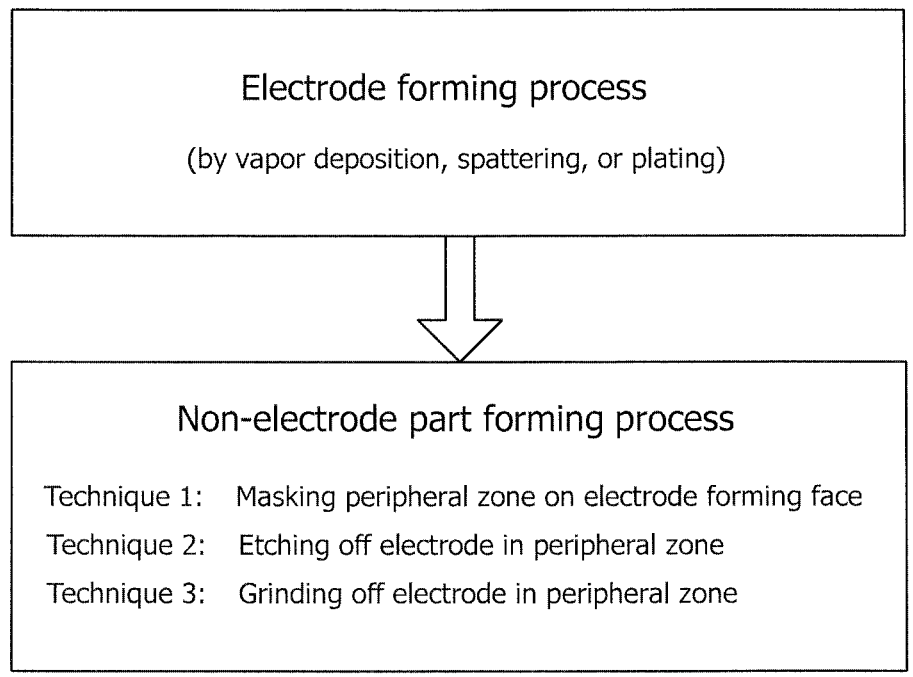
FIG. 4 is a view illustrating a method of forming an electrode of a piezoelectric element according to an embodiment of the present invention.

The method according to the embodiment of FIG. 4 includes forming the electrode 41a on the electrode forming face 31a of the piezoelectric element 21a and forming the non-electrode part 51 in the peripheral zone 31a1 of the electrode forming face 31a.

In the electrode forming process, the electrode 41a is formed by, for example, one of vapor deposition, spattering, and plating.

In the non-electrode part forming process, the non-electrode part 51 is formed in the peripheral zone 31a1 of the electrode forming face 31a according to one of three techniques 1 to 3 mentioned in FIG. 4.

The technique 1 covers the peripheral zone 31a1 of the electrode forming face 31a with a mask before forming the electrode 41a on the electrode forming face 31a by one of the vapor deposition, spattering, and plating. The mask forms the non-electrode part 51. The mask is formed by, for example, making a hole corresponding to the electrode 41a in a metal thin plate such as a stainless steel thin plate.

The technique 2 first forms the electrode 41a entirely over the electrode forming face 31a by one of the vapor deposition, spattering, and plating, and then, etches off the electrode 41a in the peripheral zone 31a1 of the electrode forming face 31a, thereby forming the non-electrode part 51.

The technique 3 first forms the electrode 41a entirely over the electrode forming face 31a by one of the vapor deposition, spattering, and plating, and then, grinds off the electrode 41a in the peripheral zone 31a1 of the electrode forming face 31a with the use of, for example, a grinder or a dicing blade, thereby forming the non-electrode part 51.

Figure 5:
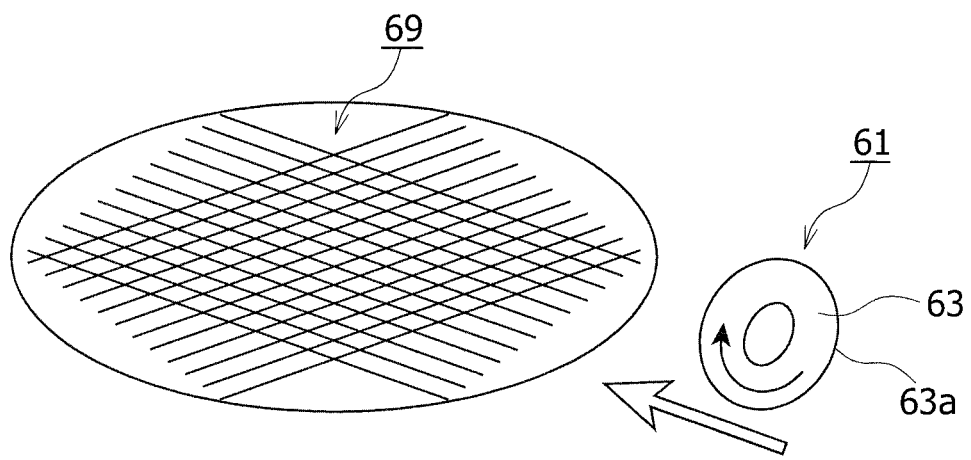
FIG. 5 is a view illustrating a method of cutting a wafer with a dicing blade into piezoelectric elements according to an embodiment of the present invention.

The technique 3 will be explained in more detail with reference to FIGS. 5 to 6C in which FIG. 5 illustrates cutting a wafer with a dicing blade into piezoelectric elements, FIG. 6A is an enlarged view of the dicing blade. FIG. 6B is a sectional view of a piezoelectric element with an electrode on one electrode forming face being tapered, and FIG. 6C is a sectional view of a piezoelectric element with electrodes on both electrode forming faces being tapered.

In FIGS. 5 and 6A, the dicing blade 61 has a rotary disk 63, a grinding shoulder 65, and a grinding blade 67. The shoulder 65 and blade 67 are formed on an outer circumferential edge 63a of the disk 63. The dicing blade 61 is used to cut a wafer 69 into piezoelectric elements of a predetermined shape.

The grinding shoulder 65 has oblique cutting faces 65a and 65b that extend sideward from the center of the disk 63. The grinding blade 67 has an outwardly extending blade part 67a.

The dicing blade 61 is turned and is made in contact with the wafer 69, so that the blade part 67a of the blade 67 cuts the wafer 69 into individual piezoelectric elements.

When cutting each piezoelectric element, the oblique cutting face 65a (or 65b) grinds the electrode 41a on the electrode forming face 31a, to taper the electrode 41a. This forms the non-electrode part 51 in the peripheral zone 31a1 of the electrode forming face 31a.

Instead of the dicing blade, a non-contact dicing technique such as a laser dicing technique may be employed to form the non-electrode part 51.

When the above-mentioned process is carried out on one face of the wafer 69, the electrode forming face 31a has the non-electrode part 51 in the peripheral zone 31a1 and the electrode forming face 31b has no non-electrode part 51 and is entirely covered with the electrode 41b, as illustrated in FIGS. 3B and 6B.

When the above-mentioned process is carried out on each face of the wafer 69, the electrode forming faces 55a and 55b have the peripheral zones 55a1 and 55b1, the lower and upper electrodes 57a and 57b surrounded by the peripheral zones 55a1 and 55b1, and the non-electrode parts 51 formed in the peripheral zones 55a1 and 55b1, as illustrated in FIGS. 3C and 6C.

The technique 1 that forms the non-electrode part 51 by covering the peripheral zone 31a1 of the electrode forming face 31a with a mask is capable of easily forming the non-electrode part 51.

The technique 2 that forms the non-electrode part 51 by etching off the electrode 41a in the peripheral zone 31a1 of the electrode forming face 31a is capable of accurately forming the non-electrode part 51. For example, the technique 2 is appropriate for accurately forming a very narrow non-electrode part.

The technique 3 that forms the non-electrode part 51 by grinding off the electrode 41a in the peripheral zone 31a1 of the electrode forming face 31a with the use of a grinder or a dicing blade is capable of accurately forming the non-electrode part 51 even if the non-electrode part 51 is narrow. The technique 3 forms the non-electrode parts when cutting a wafer into piezoelectric elements. Namely, the technique 3 needs no separate processes to form the non-electrode parts, and therefore, contributes to simplify the manufacturing of piezoelectric elements.

Operation of the head suspension 11 (FIG. 1) employing the piezoelectric element electrode structure according to the above-mentioned embodiment will be explained.

Figure 7A:
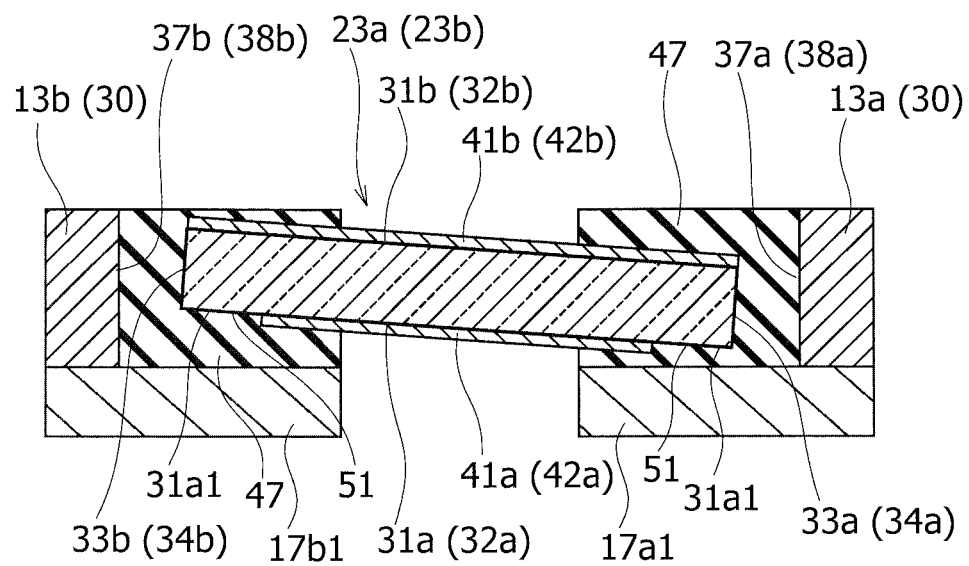
Figure 7B:
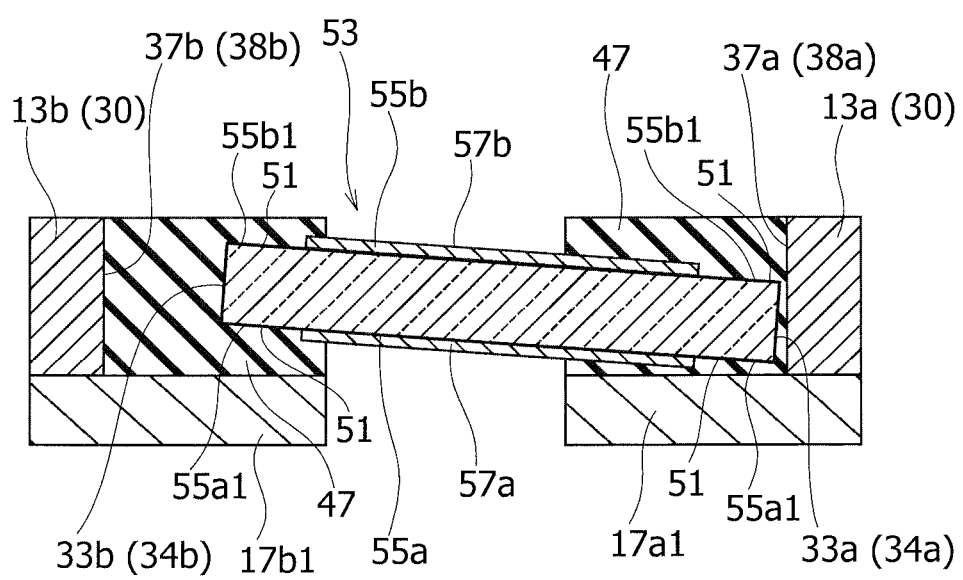

FIG. 7A illustrates operation of the head suspension 11 employing the piezoelectric element electrode structure according to the embodiment of FIGS. 3A and 3B and FIG. 7B illustrates operation of the head suspension 11 employing the piezoelectric element electrode structure according to the modification of FIG. 3C.

In FIG. 7A, the piezoelectric element 21a has the non-electrode part 51 in the peripheral zone 31a1 on the lower electrode forming face 31a.

If the piezoelectric element 21a (or 21b) is obliquely attached as illustrated in FIG. 7A, an outer circumferential edge of the piezoelectric element 21a may come into contact with the support 17a1. Even if this happens, the non-electrode part 51 surrounding the electrode 41a prevents a short circuit between the electrode 41a and the attaching part 30 of the head suspension 11.

In this way, this embodiment prevents a short circuit between the electrodes 41a and 42a of the piezoelectric elements 21a and 21b and the attaching part 30 of the head suspension 11 when and after attaching the piezoelectric elements 21a and 21b to the actuator base (attaching part) 30 of the head suspension 11.

In FIG. 7B, the piezoelectric element 53 of the modification illustrated in FIG. 3C has the non-electrode part 51 in each of the peripheral zones 55a1 and 55b1 on the lower and upper electrode forming faces 55a and 55b.

Even if the piezoelectric element 53 is obliquely arranged close to the inner side face 37a of the opening 23a so that an outer circumferential edge of the piezoelectric element 53 comes in contact with the support 17a1 and inner side face 37a as illustrated in FIG. 7B, the non-electrode parts 51 in the peripheral zones 55a1 and 55b1 surrounding the electrodes 57a and 57b prevent a short circuit between the electrodes 57a and 57b of the piezoelectric element 53 and the attaching part (including the opening 23a and support 17a1) of the head suspension.

In this way, the modification prevents a short circuit between the electrodes 57a and 57b of the piezoelectric element 53 and the attaching part 30 of the head suspension 11 when and after attaching the piezoelectric element 53 to the attaching part (actuator base) 30.

According to the above-mentioned embodiment and modification, the piezoelectric elements are embedded in the actuator base (attaching part) 30 of the head suspension.

This configuration allows each piezoelectric element to easily be positioned with respect to the attaching part, prevents the piezoelectric element from being damaged, and effectively protect the piezoelectric element that is brittle.

Figure 8:
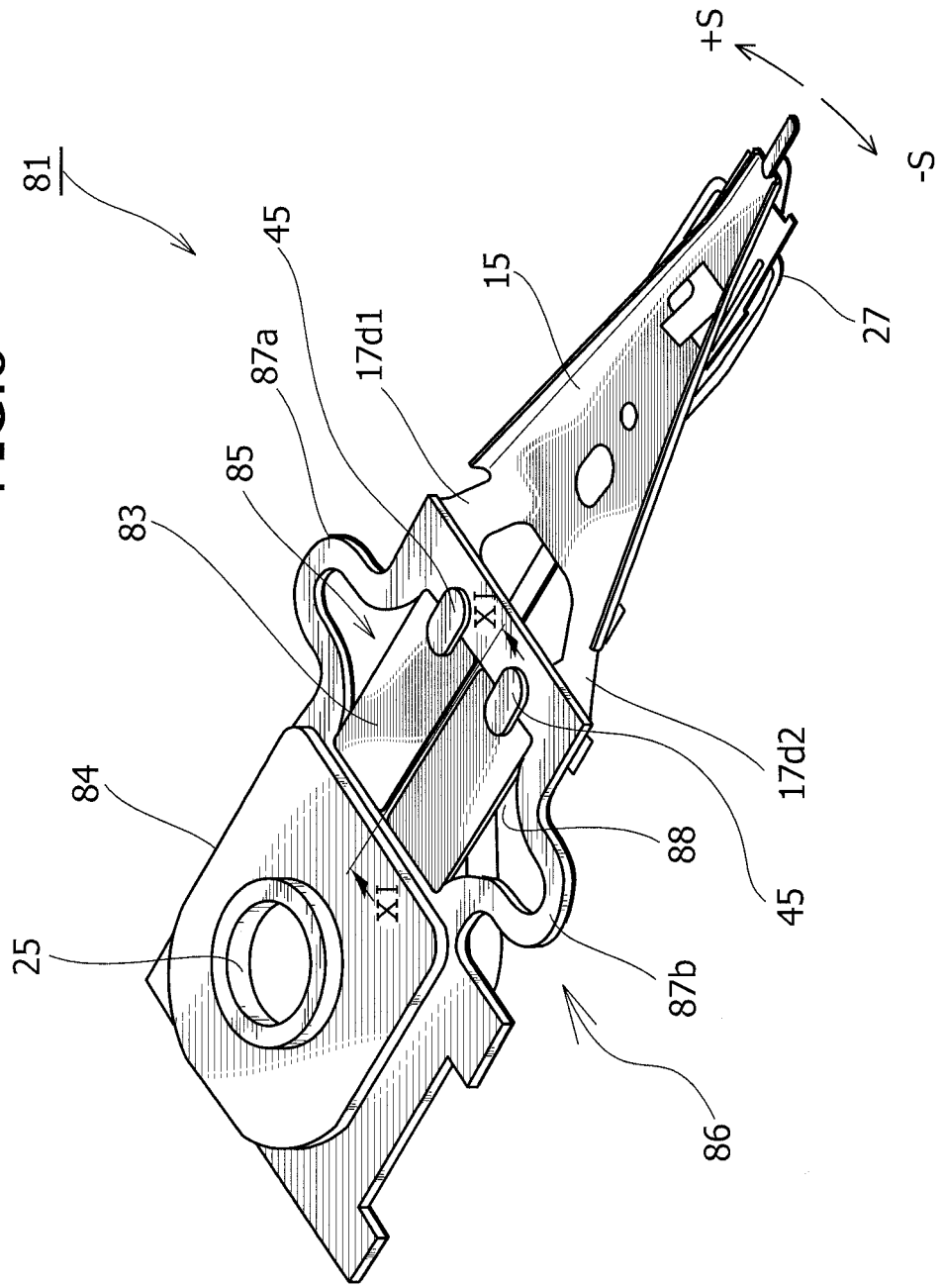
FIG. 8 is a perspective view illustrating a head suspension employing a piezoelectric element electrode structure according to another embodiment of the present invention.
Figure 9:
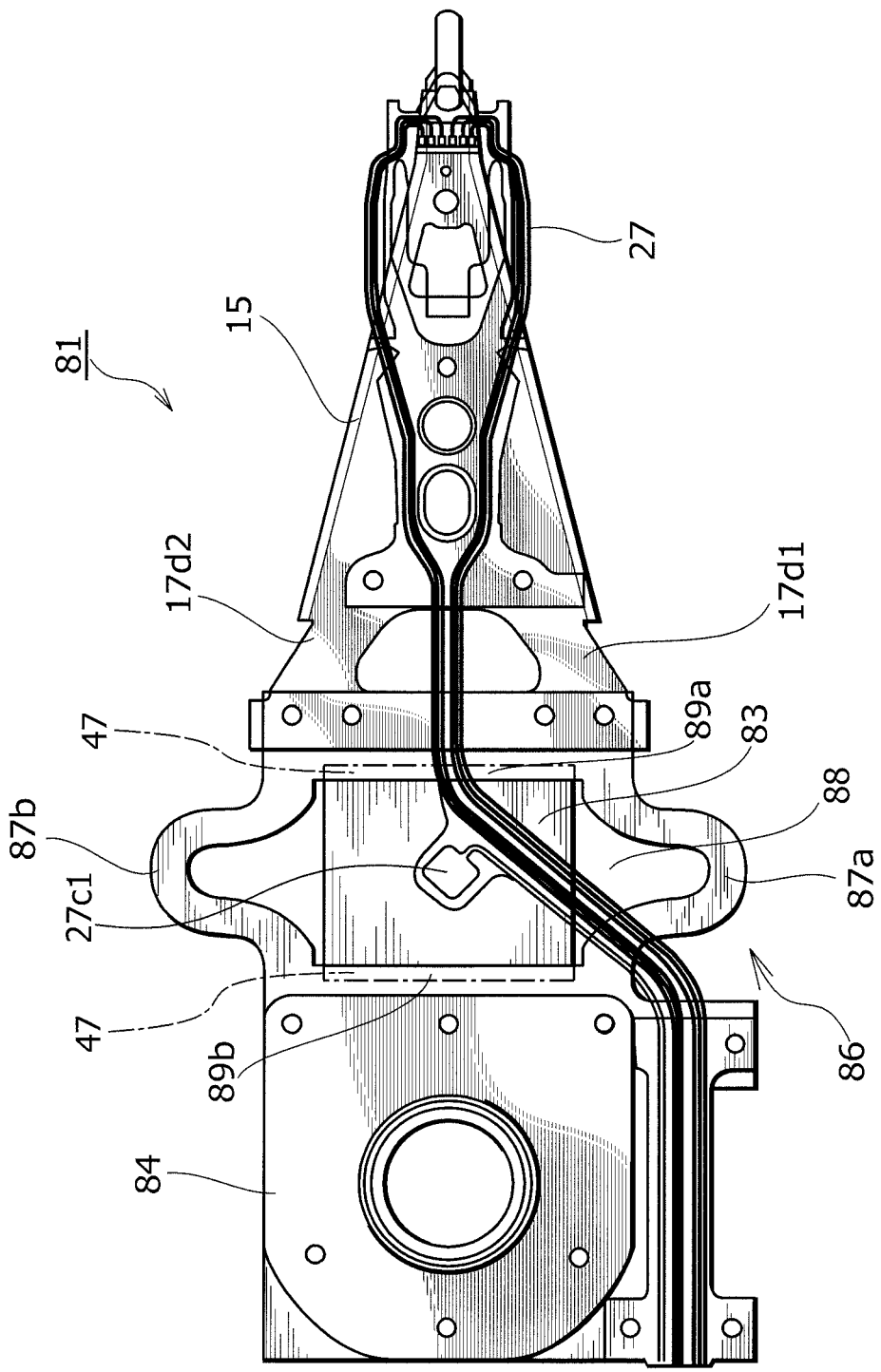
FIG. 9 is a bottom view of the head suspension of FIG. 8.
Figure 10A:
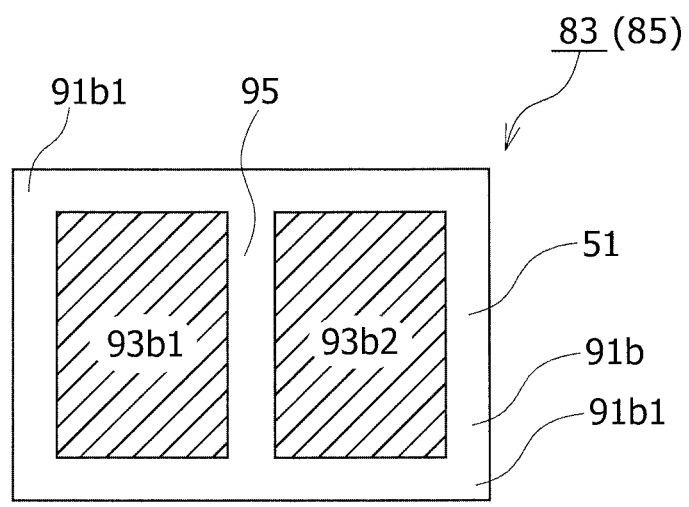
Figure 10B:
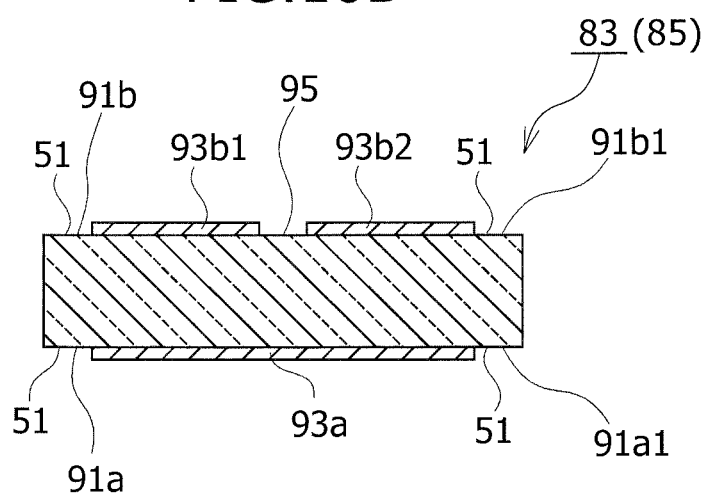

A head suspension employing a piezoelectric element electrode structure according to another embodiment of the present invention will be explained with reference to FIGS. 8 to 10B in which FIG. 8 is a perspective view of the head suspension, FIG. 9 is a bottom view of the head suspension, FIG. 10A is a top view of the piezoelectric element, and FIG. 10B is a front view of the piezoelectric element.

The head suspension 81 of FIG. 8 is basically the same as the head suspension 11 of FIG. 1 except the piezoelectric actuator and the peripheral structure thereof, and therefore, the same parts are represented with the same reference marks to avoid repetitive explanations.

The head suspension 11 of FIG. 1 has the piezoelectric actuator 19 consisting of two piezoelectric elements 21a and 21b.

The head suspension 81 of FIG. 8 has a piezoelectric actuator 85 consisting of a single piezoelectric element 83. This is an essential difference of the head suspension 81 from the head suspension 11.

In FIGS. 8 and 9, the head suspension 81 has a base plate 84 and an actuator base 86 fixed to a front end of the base plate 84. The actuator base 86 has a flexible connection parts 87a and 87b and an opening 88 to accommodate the piezoelectric element 83.

Each of the flexible connection parts 87a and 87b is outwardly curved into a U-shape at a position corresponding to a side face of the piezoelectric element 83. The flexible connection parts 87a and 87b contribute to increase the rigidity of the actuator base 86 serving as an attaching part of the piezoelectric element 83 and smoothly carry out a deforming or swaying operation of the piezoelectric element 83.

The piezoelectric element 83 is embedded in the opening 88 of the actuator base (attaching part) 86. A front end and rear end of an inner circumferential edge of the opening 88 are partially etched, to form supports 89a and 89b that inwardly protrude to widthwise support a lower electrode forming face 91a of the piezoelectric element 83.

In FIGS. 10A and 10B, the piezoelectric element 83 of the piezoelectric actuator 85 has the lower electrode forming face 91a on which a lower electrode 93a is formed and an upper electrode forming face 91b on which a pair of upper electrodes 93b1 and 93b2 are formed in parallel with each other.

On the lower electrode forming face 91a, the lower electrode 93a is surrounded by a peripheral zone 91a1 in which a non-electrode part 51 is formed.

On the upper electrode forming face 91b, the upper electrodes 93b1 and 93b2 are spaced from each other by a slit 95 and are surrounded by a peripheral zone 91b1 in which a non-electrode part 51 is formed.

The piezoelectric actuator 85 is manufactured according to the method explained with reference to FIGS. 4 to 6C.

Operation of the head suspension 81 will be explained with reference to FIG. 11 that is a sectional view taken along a line XI-XI of FIG. 8.

Figure 11:
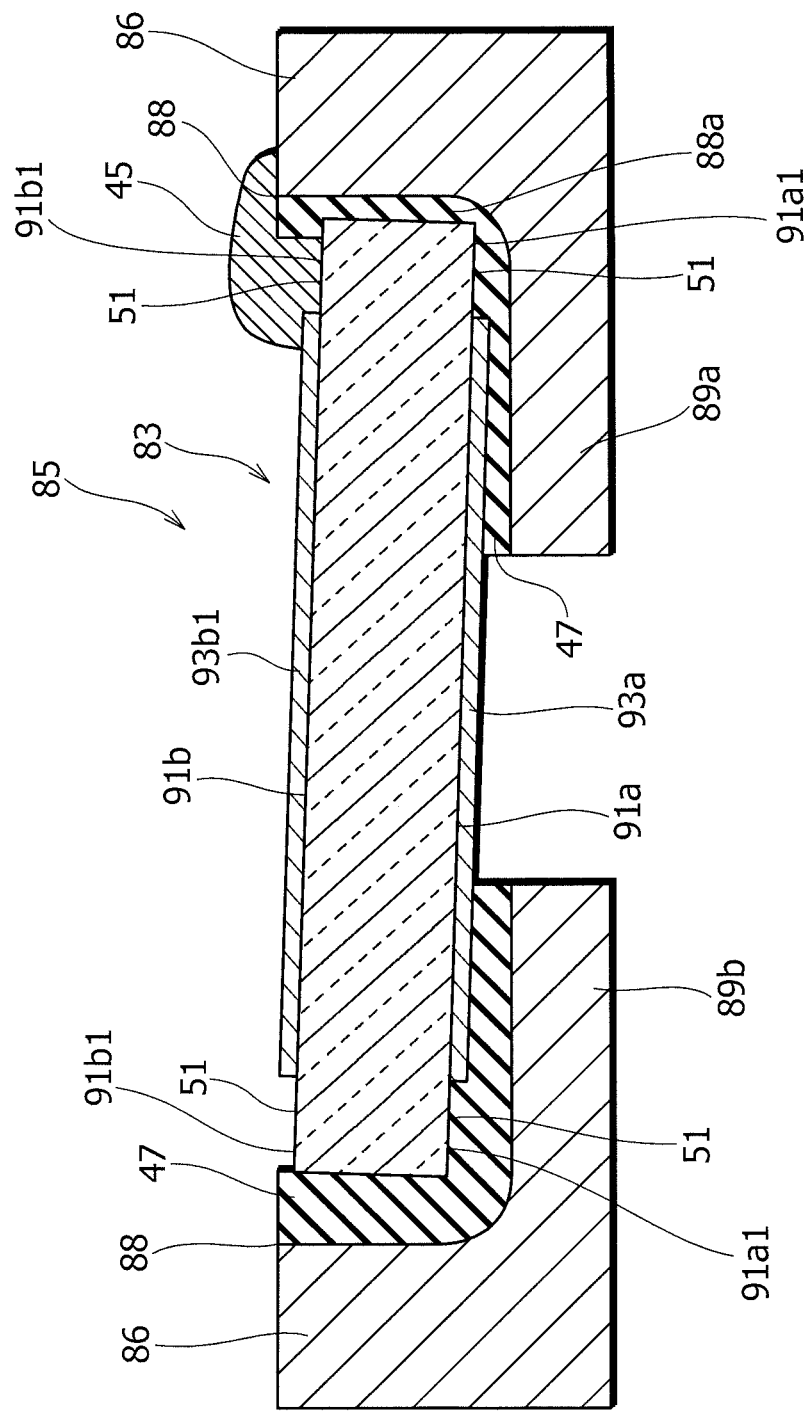
FIG. 11 is a view illustrating operation of the head suspension of FIG. 8.

In FIG. 11, the piezoelectric actuator 85 has the non-electrode part 51 in each of the peripheral zones 91a1 and 91b1 defined on the lower and upper electrode forming faces 91a and 91b that need a short-circuit preventive measure.

Even if the piezoelectric element 83 is obliquely installed close to an inner side face 88a of the opening 88 so that the peripheral zones 91a1 and 91b1 of the piezoelectric element 83 touch the support 89a or the inner side face 88a as illustrated in FIG. 11, the non-electrode part 51 in each of the peripheral zones 91a1 and 91b1 prevents a short circuit between the electrodes 93a, 93b1, and 93b2 of the piezoelectric element 83 and the actuator base (attaching part) 86 (including the opening 88 and supports 89a and 89b) of the head suspension 81.

In this way, the piezoelectric element 83 can be attached to the actuator base (attaching part) 86 of the head suspension 81 without causing a short circuit between the electrodes 93a, 93b1, and 93b2 of the piezoelectric element 83 and the attaching part 86.

The present invention is not limited to the above-mentioned embodiments and is modifiable within the gist and technical idea stipulated and suggested in the claims and specification. Electrode structures of piezoelectric elements, methods of forming electrodes of piezoelectric elements, piezoelectric actuators, and head suspensions based on such modifications also fall in the scope of the present invention.

For example, in FIGS. 1 and 2, the hinge member 17 is laid on the back of the base plate 13, to form the supports 17a1 and 17b1. This configuration does not limit the present invention. As illustrated in FIGS. 8 and 9, it is possible to process the actuator base 86 fixed to the front end of the base plate 84 into the supports 89a and 89b. The actuator base 86 may be integral with the base plate 84.

According to the above-mentioned embodiments, the piezoelectric actuator 19 (85) is arranged between the base plate 13 (84) and the load beam 15. The present invention is not limited to this configuration. For example, in a head moving mechanism in which a head suspension is fixed to a carriage arm that is turned to move a magnetic head attached to a slider of the head suspension, the piezoelectric actuator according to the present invention may be arranged at a proper position to minutely move any one of the head suspension, slider, and magnetic head.

What is claimed is:

1. A method of forming an electrode of a piezoelectric element, the piezoelectric element having a pair of electrode forming faces and being used to constitute a piezoelectric actuator in which one of the electrode forming faces of the piezoelectric element includes opposite ends that face and are supported by respective supports protruding inside an opening of an actuator base, the supports having distal ends that oppose each other by a distance in a protruding direction, the piezoelectric actuator arranged on an object to minutely move a movable part of the object relative to a base part of the object according to deformation occurring on the piezoelectric element in response to a power applied state of the piezoelectric element, the method comprising:

forming an electrode on said one of the electrode forming faces; and forming a non-electrode part in a region of each one of the opposite ends on said one of the electrode forming faces to be put to face a corresponding one of the supports by inwardly offsetting an edge of the electrode that extends along the distal end of the corresponding one of the supports toward the other of the opposite ends with respect to an edge of the piezoelectric element in the same region, the non-electrode part defined out of the edge of the electrode to be put to face the corresponding one of the supports together with the edge of the electrode.

2. The method of claim 1, wherein:
the electrode is formed by a technique selected from the group consisting of vapor deposition, spattering, and plating.

3. The method of claim 2, wherein:
the non-electrode part is formed by masking the peripheral zone of the electrode forming face when forming the electrode on the electrode forming face.

4. The method of claim 2, wherein:
the non-electrode part is formed by etching off the electrode in the peripheral zone of the electrode forming face.

5. The method of claim 2, wherein:
the non-electrode part is formed by grinding off the electrode in the peripheral zone of the electrode forming face.

6. The method of claim 5, wherein:
grinding off the electrode in the peripheral zone of the electrode forming face is carried out with a disk-shaped dicing blade when cutting a wafer with the dicing blade into the piezoelectric element;
the dicing blade has an oblique cutting face at least on one side of a thickness center of the dicing blade; and
the non-electrode part is formed by the oblique cutting face when the piezoelectric element is cut from the wafer with the use of the dicing blade.

7. A method of forming an electrode of a piezoelectric element used for a head suspension by means of the method of claim 1, the head suspension has a base plate, a load beam, a hinge member through which the load beam is longitudinally attached to the base plate along a longitudinal direction of the base, a flexure attached to the load beam to support a magnetic head, an opening formed through the base plate between a base part and a front part of the base plate in a longitudinal direction of the load beam, the hinge member longitudinally protruding into the opening and forming front and rear supports at respective front and rear ends of the opening that extend throughout a bottom portion of the opening, the piezoelectric element disposed in the opening and having front and rear portions thereof respectively attached to the front and rear supports at the respective front and rear ends of the opening by a nonconductive adhesive so that the piezoelectric element minutely moves the magnetic head relative to and in a widthwise direction of the head suspension according to deformation occurring on the piezoelectric element in response to power being applied to the piezoelectric element, the piezoelectric element comprising upper and lower electrodes for applying the power at respective upper and lower surfaces of the piezoelectric element, the lower electrode of the piezoelectric element comprising a peripheral edge disposed inwardly and away from a peripheral edge of the piezoelectric element so as to define a non-electrode portion along the peripheral edge of the lower surface of the piezoelectric element, the lower electrode being connected to a terminal of the flexure, and the peripheral edge of the lower electrode and the non-electrode portion being fixed to the front and rear supports through the nonconductive adhesive at the front and rear portions of the piezoelectric element, wherein one of the upper and lower surfaces includes opposite ends that face and are supported by respective supports protruding inside an opening of an actuator base, the supports having distal ends that oppose each other by a distance in a protruding direction, wherein the electrode is formed on the upper and lower surfaces by a technique selected from the group consisting of vapor deposition, spattering, and plating, wherein the non-electrode portion is formed in a region of each one of the opposite ends on said one of the upper and lower surfaces to be put to face a corresponding one of the supports by inwardly offsetting an edge of the electrode that extends along the distal end of the corresponding one of the supports toward the other of the opposite ends with respect to an edge of the piezoelectric element in the same region, the non-electrode part defined out of the edge of the electrode to be put to face the corresponding one of the supports together with the edge of the electrode, and wherein the non-electrode portion is formed by masking said region when forming said electrode by said technique selected from the group consisting of vapor deposition, spattering, and plating.

* * * * *